(12) United States Patent
Spitz et al.

(10) Patent No.: US 6,806,173 B1
(45) Date of Patent: Oct. 19, 2004

(54) METHOD FOR PRODUCING HIGHLY DOPED SEMICONDUCTOR COMPONENTS

(75) Inventors: Richard Spitz, Reutlingen (DE); Alfred Goerlach, Kusterdingen (DE); Barbara Will, Herrenberg (DE); Helga Uebbing, Reutlingen (DE); Roland Riekert, Engstingen (DE); Christian Adamski, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/914,404
(22) PCT Filed: Feb. 25, 2000
(86) PCT No.: PCT/DE00/00546
§ 371 (c)(1),
(2), (4) Date: Dec. 13, 2001
(87) PCT Pub. No.: WO00/52738
PCT Pub. Date: Sep. 8, 2000

(30) Foreign Application Priority Data

Feb. 26, 1999 (DE) .......................................... 199 08 400

(51) Int. Cl.[7] .......................... H01L 21/24; H01L 21/38
(52) U.S. Cl. ........................ 438/559; 438/237; 438/563
(58) Field of Search ................................ 438/559, 563, 438/237, FOR 321, FOR 324

(56) References Cited

U.S. PATENT DOCUMENTS

| 3,907,615 | A | * | 9/1975 | Weijland | 438/134 |
|---|---|---|---|---|---|
| 4,099,997 | A | * | 7/1978 | Rosnowski | 438/133 |
| 4,104,091 | A | * | 8/1978 | Evans et al. | 438/57 |
| 4,889,492 | A | * | 12/1989 | Barden et al. | 438/247 |
| 5,496,765 | A | * | 3/1996 | Schwalke | 438/404 |
| 5,770,490 | A | * | 6/1998 | Frenette et al. | 438/168 |
| 5,834,346 | A | * | 11/1998 | Sun et al. | 438/231 |
| 6,020,644 | A | * | 2/2000 | Tanigawa | 257/775 |
| 6,057,216 | A | * | 5/2000 | Economikos et al. | 438/249 |
| 6,057,251 | A | * | 5/2000 | Goo et al. | 438/487 |
| 6,360,685 | B1 | * | 3/2002 | Xia et al. | 118/695 |

FOREIGN PATENT DOCUMENTS

| JP | 59080928 A | * | 5/1984 | H01L/21/22 |
|---|---|---|---|---|
| JP | 61064125 A | * | 4/1986 | H01L/21/22 |

* cited by examiner

*Primary Examiner*—George Fourson
*Assistant Examiner*—Michelle Estrada
(74) *Attorney, Agent, or Firm*—Kenyon & Kenyon

(57) ABSTRACT

A method is proposed for producing semiconductor components, in which at least one doped region is introduced in a wafer, a solid glass layer provided with dopant being applied on at least one of the two sides of a semiconductor wafer, in another step, the wafer being heated to high temperatures so that the dopant from the glass layer penetrates deep into the wafer to produce the at least one doped region; and in a further step, the glass layer being removed. The method is used for producing homogeneous, heavily doped regions, it also being possible to introduce these regions in the wafer on both sides and for the regions to be of different doping type.

18 Claims, 3 Drawing Sheets

METHOD FOR PRODUCING HIGHLY DOPED SEMICONDUCTOR COMPONENTS

FIELD OF THE INVENTION

The present invention relates to a method for producing semiconductor components.

BACKGROUND INFORMATION

When manufacturing semiconductor components, it is known to produce doped regions in a semiconductor wafer with the aid of ion implantation, gas-phase coating (for example, with diborane or POC13), film diffusion or using liquid solutions.

SUMMARY OF THE INVENTION

In contrast, the method of the present invention has the advantage that doped regions with very good homogeneity can be produced. To be regarded as a further advantage is that it is possible, both on the front side and on the back side of the semiconductor wafer, to introduce such homogeneous regions even of different doping types in only one diffusion step. It is also possible to provide different levels of dopant concentration on the front side and back side. The heating of the wafer, and with it, the driving of the doping atoms into the interior of the wafer for producing doped regions at high temperatures in the range of about 1200 to 1280 degrees Celsius advantageously ensures a deep and concentrated penetration of the doping atoms into the wafer.

It is particularly advantageous to coat the wafer surfaces with doping atoms using a chemical vapor deposition method, particularly a chemical vapor deposition method at atmospheric pressure (APCVD, "Atmospheric Pressure Chemical Vapor Deposition"). It is thereby possible to achieve extremely high dopant concentrations which reach up to the solubility limit of the silicon wafer.

It is also particularly advantageous to heat the wafer, covered with a glass layer, in oxidizing atmosphere. This advantageously allows the dopant to diffuse into the interior of the wafer in acceptable periods of time.

Furthermore, it is advantageous to cover the glass layer, provided with dopant, with a neutral glass layer prior to the diffusion process. A mutual influencing of the doping of the front side and back side, or of different wafers set up in the diffusion oven at the same time, is thereby reliably prevented.

DETAILED DESCRIPTION

Figure 1:
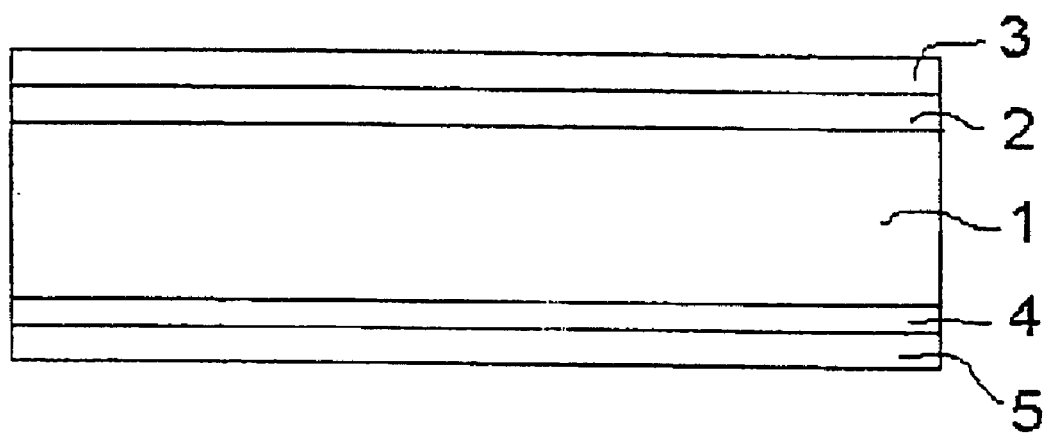
FIG. 1 shows a wafer with applied glass layer.

FIG. 1 shows a side view of a wire-sawed raw wafer 1 having great surface roughness, upon whose front side a p-doped glass layer 2 is applied, and upon whose back side an n-doped glass layer 4 is applied. Doped glass layers 2 and 4 are covered with a neutral glass layer 3 and 5, respectively.

Glass layers 2 and 4 are used for coating the wafer with dopants. In detail, the production proceeds in the following steps: Raw wafer 1 is first of all heated to about 380 degrees Celsius. This is carried out in that the wafer, in turn with further wafers, is brought on a conveyor belt into a heating chamber provided with gas injectors. The glass layer is subsequently deposited in an APCVD process (APCVD= "Atmospheric Pressure Chemical Vapor Deposition"), thus, a chemical vapor deposition process under atmospheric pressure. In so doing, for example, first of all the front side of the wafer is exposed to a silane gas, in that gas from the gas injectors to be passed on the conveyor belt flows onto the surface of the wafer. In the case of the front side, B2H6 is admixed to the silane gas. The silane decomposes on the wafer surface heated to 380 degrees Celsius and reacts with oxygen to form silicon dioxide. Because of the B2H6 admixture, this glass is laced with a p-type dopant. Glass layer 2 is grown to a layer thickness of about 2 micrometers. The admixture of the B2H6 gas has been selected in such a way that the glass layer has a boron constituent of about 6 percentage by weight. The glass layer is subsequently exposed to the same silane gas, however, without the addition of B2H6. Neutral glass layer 3 thereby grows on glass layer 2. The process is ended when neutral glass layer 3 has a thickness of about 0.5 micrometers. In a further step, the wafer is turned over and correspondingly coated on the back side with an n-doped glass layer 4 (thickness 2 micrometers, phosphorus constituent of about 6 percentage by weight). The n-doping is achieved by admixing PH3 to the silane gas instead of B2H6. Subsequently, analogous to the front side, a neutral glass layer 5 having a thickness of 0.5 micrometers is applied.

As an alternative to the silane gas method described, the so-called TEOS method (TEOS=tetra-ethyl-ortho-silicate) can be used, which can likewise proceed under normal pressure. In this case, instead of silane gas, $Si(OC_2H_5)_4$ gas is used, the tetraethyl orthosilicate depositing on the wafer surface decomposing on the surface heated to 380 degrees Celsius and reacting with oxygen to form silicon dioxide. In this case, the doping is effected by gas admixture of trimethyl phosphate or trimethyl borate.

Figure 2:
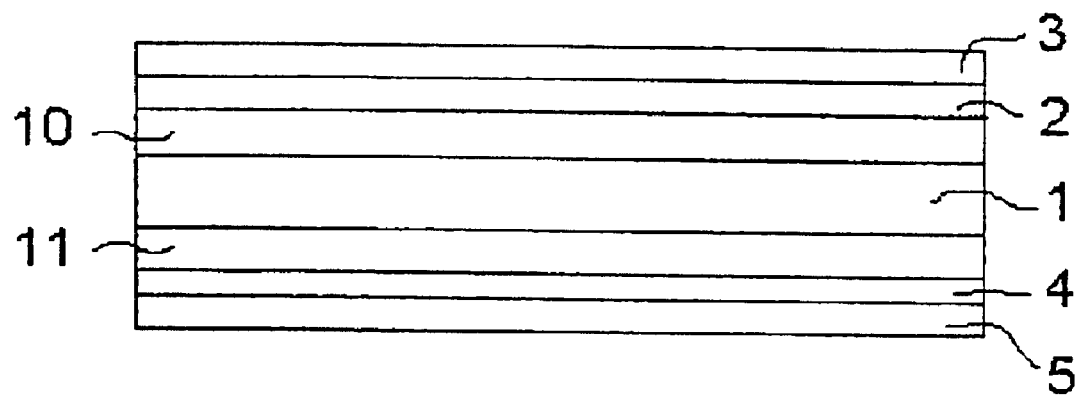
FIG. 2 shows a wafer after a diffusion process.

FIG. 2 shows the wafer after a diffusion process, having a heavily p-doped region 10 and a heavily n-doped region 11.

The diffusion process, carried out after the coating with doped glass layers, takes place in a diffusion oven at a temperature of 1200 to 1280 degrees Celsius, preferably at a temperature of about 1265 degrees Celsius. A plurality of wafers to be processed simultaneously are arranged upright in a setup made of silicon carbide or polysilicon and having retaining elements. This heating is maintained approximately 20 to 30 hours, preferably 21 hours, and in particular is carried out in oxidizing atmosphere. With a diffusion time of 21 hours for driving the dopants, stored on the surface in the form of glass layers, into the interior of the wafer, phosphorus and boron dosages, respectively, of about 1–2× $10^{17}$ cm$^{-2}$ are achieved in regions 10 and 11. This is a dosage higher by an order of magnitude than for semiconductor applications otherwise typical.

In alternative specific embodiments of the diffusion step, it is also possible to stack wafers to be processed simultaneously, direct mutual contact of the wafers being prevented by sprinkling with aluminum oxide powder beforehand, or by interposing neutral films, known from film diffusion.

Figure 3:
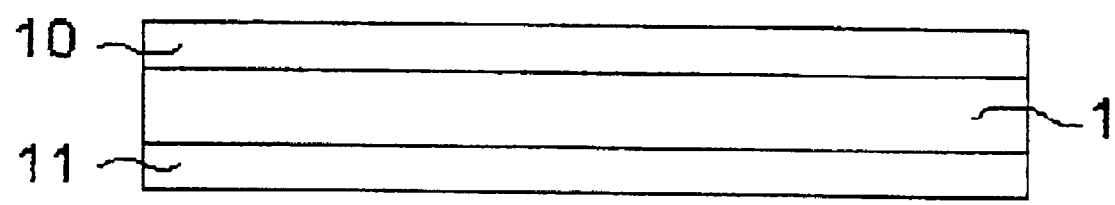
FIG. 3 shows a wafer after removing the glass layer.

In a further step, using, for example, 50 percentage hydrofluoric acid, applied glass layers 2, 3, 4 and 5 are removed again, resulting in wafer 1 shown in FIG. 3 that is doped on both sides with a heavily p-doped region 10 on the front side and a heavily n-doped region 11 on the back side. This wafer can now be used, for instance, for producing high-blocking-capability p-n diodes (two-layer diodes) by applying metal contactings on both sides in further steps. To produce the metal contactings, for example, metal layers are deposited by sputtering simultaneously on both sides of the wafer, first of all a chromium layer 70 nanometers thick, followed by a nickel-vanadium layer 160 nanometers thick and a silver layer 100 nanometers thick. The wafer is subsequently divided along dividing lines into individual diode chips, the dividing lines having optionally already been introduced into the wafer by sawing prior to applying the metal contactings.

The method of the present invention is suitable not only for two-layer diodes, but can also be utilized in appropriately modified form for producing multi-layered diodes, particularly diode thyristors (four-layer diodes) and three-layer diodes (transistor diodes). Power semiconductors, e.g. power diodes, in particular can be easily and reliably produced by the high doping dosages attainable. Thyristors and bipolar transistors can also be produced with the method.

What is claimed is:

1. A method for producing a semiconductor component in which at least one doped region is introduced into a semiconductor wafer, comprising the steps of:

applying a solid glass layer both on the front side of the semiconductor wafer and on the back side of the semiconductor wafer, a doping type of the dopant on the back side being opposite compared to the doping type of the dopant on the front side;

heating the semiconductor wafer to a high temperature of at least 1200 degrees centigrade while the glass layer is applied so that the dopant from the solid glass layer penetrates into the semiconductor wafer to produce the at least one doped region;

applying a neutral glass layer on the solid glass layers prior to heating the semiconductor wafer;

removing the neutral glass layers together with the solid glass layers after heating the semiconductor wafer; and providing the dopant at a dosage of at least $10^{17}/cm^2$ in the at least one doped region;

wherein the step of applying the solid glass layer is performed in accordance with a chemical vapor deposition at atmospheric pressure.

2. The method according to claim 1, wherein:
the step of heating the semiconductor wafer is performed in an oxidizing atmosphere.

3. The method according to claim 1, further comprising the step of:
maintaining the high temperature for about 20 to 30 hours.

4. The method according to claim 1, further comprising the step of:
maintaining the high temperature for 21 hours.

5. The method according to claim 1, wherein:
the solid glass layer has a dopant constituent of greater than 2 percentage by weight.

6. The method according to claim 1, wherein:
the solid glass layer has a dopant constituent of about 3 to 6 percentage by weight.

7. The method according to claim 1, wherein:
the solid glass layer has a thickness of about 2 micrometers.

8. The method according to claim 1, wherein:
the neutral glass layer has a thickness of about 0.5 micrometers.

9. The method according to claim 1, wherein:
the step of removing the solid glass layer is performed in accordance with hydrofluoric acid.

10. The method according to claim 1, wherein the high temperature is between 1200 and 1280 degrees centigrade.

11. A method for producing a semiconductor component in which at least one doped region is introduced into a semiconductor wafer, comprising:

applying a solid glass layer provided with a dopant on both sides of the semiconductor wafer;

heating the semiconductor wafer to a high temperature of at least 1200 degrees centigrade while the glass layer is applied so that the dopant from the solid glass layer penetrates into the semiconductor wafer to produce the at least one doped region;

applying a neutral glass layers on the solid glass layer prior to heating the semiconductor wafer;

removing the neutral glass layers together with the solid glass layers after heating the semiconductor wafer; and providing the dopant at a dosage of at least $10^{17}/cm^2$ in the at least one doped region;

wherein the solid glass layer is applied using chemical vapor deposition at atmospheric pressure; and wherein the dopant constituent of the solid glass layer on a front side of the semiconductor wafer is different from the dopant constituent of the solid glass layer on a back side of the semiconductor wafer.

12. The method of claim 1, wherein silane gas and $B_2H_6$ gas is used in the chemical vapor deposition to generate silicon dioxide and p-type dopants.

13. The method of claim 1, wherein silane $PH_3$ gas is used in the chemical vapor deposition to generate silicon dioxide and n-type dopants.

14. The method of claim 1, wherein tetra-ethyl-ortho-silicate gas and trimethyl borate is used in the chemical vapor deposition to generate silicon dioxide and p-type dopants.

15. The method of claim 1, wherein tetra-ethyl-ortho-silicate gas and trimethyl phosphate is used in the chemical vapor deposition to generate silicon dioxide and n-type dopants.

16. A method for producing a semiconductor component in which at least one doped region is introduced into a semiconductor wafer, comprising:

applying a solid glass layer provided with a dopant on both sides of the semiconductor wafer;

heating the semiconductor wafer to a high temperature of at least 1200 degrees centigrade while the glass layer is applied so that the dopant from the solid glass layer penetrates into the semiconductor wafer to produce the at least one doped region;

applying a neutral glass layer on the solid glass layers prior to heating the semiconductor wafer;

removing the neutral glass layers together with the solid glass layers after heating the semiconductor wafer; and providing the dopant at a dosage of at least $10^{17}/cm^2$ in the at least one doped region;

wherein the dopant constituent of the solid glass layer on a front side of the semiconductor wafer is different from the dopant constituent of the solid glass layer on a back side of the semiconductor wafer and the solid glass layer is applied using a chemical vapor deposition at atmospheric pressure using a tetra-ethyl-ortho-silicate gas.

17. The method of claim 16, wherein the neutral glass layer has a thickness of about 0.5 micrometers.

18. The method of claim 16, wherein the high temperature is between 1200 and 1280 degrees centigrade.

* * * * *